(12) United States Patent
Liao

(10) Patent No.: US 7,262,966 B2
(45) Date of Patent: Aug. 28, 2007

(54) HEAT SINK MODULES FOR LIGHT AND THIN ELECTRONIC EQUIPMENT

(75) Inventor: Wen-Chih Liao, Taichung (TW)

(73) Assignee: Rhinol Tech Corp., Taichung (TW)

( * ) Notice: Subject to any disclaimer, the term of this patent is extended or adjusted under 35 U.S.C. 154(b) by 290 days.

(21) Appl. No.: 11/127,994

(22) Filed: May 11, 2005

(65) Prior Publication Data

US 2006/0002090 A1 Jan. 5, 2006

(30) Foreign Application Priority Data

May 28, 2004 (TW) .............................. 93208352 U

(51) Int. Cl.
*H05K 7/20* (2006.01)
(52) U.S. Cl. ...................... 361/699; 361/705
(58) Field of Classification Search ............... 361/698, 361/699, 705, 710
See application file for complete search history.

(56) References Cited

U.S. PATENT DOCUMENTS

| 6,257,320 | B1 | 7/2001 | Wargo |
| 6,302,192 | B1 | 10/2001 | Dussinger et al. |
| 6,336,497 | B1 | 1/2002 | Lin |
| 6,466,442 | B2 | 10/2002 | Lin |
| 6,528,878 | B1 * | 3/2003 | Daikoku et al. ............ 257/714 |
| 6,745,824 | B2 | 6/2004 | Lee et al. |
| 6,880,626 | B2 * | 4/2005 | Lindemuth et al. ..... 165/104.26 |
| 6,988,534 | B2 * | 1/2006 | Kenny et al. .............. 165/80.4 |
| 6,988,535 | B2 * | 1/2006 | Upadhya et al. ........... 165/80.4 |
| 7,013,956 | B2 * | 3/2006 | Thayer et al. ......... 165/104.25 |
| 7,044,199 | B2 * | 5/2006 | Thayer et al. ............. 165/80.4 |

FOREIGN PATENT DOCUMENTS

JP 11-195738 7/1999

* cited by examiner

*Primary Examiner*—Hae Moon Hyeon
(74) *Attorney, Agent, or Firm*—Townsend and Townsend and Crew LLP

(57) ABSTRACT

A heat sink module for light and thin electronic equipment, where the module includes a concave top cover, and a bottom cover having on its top surface several equidistantly spaced heat conducting fins of a certain height separated by gaps. Copper powder may cover the concave side of the top cover, and in the gaps between the fins on the top surface of the bottom to form a heat conductor. The top cover and the bottom cover are fit and brazed together to form a unit, where the gaps between the fins form a plurality of connected heat-circulating chambers that are evacuated of air and completely filled with a working fluid. Also, a method of making a heat sink module for light and thin electronic equipment is described.

14 Claims, 7 Drawing Sheets

HEAT SINK MODULES FOR LIGHT AND THIN ELECTRONIC EQUIPMENT

CROSS-REFERENCES TO RELATED APPLICATIONS

This application claims priority to Taiwanese Patent Bureau Application No. 093208352, filed May 28, 2004, the entire contents of which are hereby incorporated by reference for all purposes.

FIELD OF THE INVENTION

The present invention relates to a light and thin heat sink module especially suited for light and thin electronic equipment, such as notebook computers, wherein a phase change from liquid to gas of a functional fluid contained in heat-circulating chambers is used to absorb heat, and wherein the gaseous molecules so formed transmit thermal energy away from the heat source to obtain a high heat transfer coefficient.

BACKGROUND OF THE INVENTION

Notebooks are known for their convenience and portability. To be convenient and portable, notebooks need to be thin and light; hence, the internal space of the notebooks is limited. With the increased heat given out by the integrated circuits ("IC") of the Central Processing Unit ("CPU") and the decrease in the notebooks' volume, heat density rapidly rises and this heat cannot be dissipated in the narrow and small space provided. If the heat cannot be effectively dissipated, it will affect the performance and reliability of the product, and it can even shorten its lifespan. Accordingly, making electronic products more compact affects the components and the system. The functions of the IC chips have increased, but the area of the chips has not increased much. It has become a challenge for engineers to deal with the increasing number of transistors in the limited space and the resultant increasing heat because, unlike desktop personal computers, notebooks do not have many parts with open designs.

Generally speaking, notebook manufacturers use heat sinks, heat pipes and fans (collectively referred to as a "thermal module") to lower the heat generated during operation. After thermal modules were first incorporated into notebooks in 1997, they have become indispensable and essential components. They can come in different designs and materials to match different notebook models. The design concept of thermal modules is to bond metals of high heat transfer coefficient, such as copper or aluminum, to the surface of the CPU and to transfer the heat generated by the CPU through heat pipes to heat sinks. The heat is then circulated by convection using fans to maintain the operating CPU at a certain working temperature. Normally the thermal modules of the notebooks must be designed to maintain satisfactory convection and conduction in a narrow, limited space. The design must also take into consideration the system environment, conditions, operating temperature permitted by the system, etc. during usage to ensure that the thermal module of the CPU meets these requirements.

Whether or not a notebook will crash will greatly depend on the operating temperature of the notebook. Manufacturers of processing units such as Intel and AMD normally require the internal temperature of the notebook's CPU not to exceed 100° C. when the room temperature is 35° C. to maintain the normal operation of the CPUs. When the temperature exceeds 100° C., there are risks of the processing unit burning out.

The existing traditional heat dissipation method of a notebook system is mainly to conduct the extreme heat generated by the CPU or VGA components through a sealed surface to the heat sink first or to high heat-conducting metal pieces. The heat is then conducted through heat pipes to heat dissipating devices, such as fans, heat sinks, etc. However, the traditional method of heat dissipation through many components has resulted in relative increases in thermal resistance and cost. Furthermore, because traditional heat sinks are mostly made of aluminum alloy, heat conductivity is only average, and with the increasing heat-generating power of modern notebook components, there are blind spots to overcome.

It is foreseeable that in the future the number of the transistors will increase with the coherency of the IC chips, and functions will be more completed. Therefore, heat dissipation in notebooks during operation will be a big obstacle to be overcome.

The present invention provides a new design for a heat sink module suitable for light and thin electronic equipment that reasonably and effectively ameliorates the aforementioned deficiencies.

BRIEF SUMMARY OF THE INVENTION

Embodiments of the invention relate to heat sink modules for light and thin electronic equipment. The modules may include a concave top cover, and a bottom cover having on its top surface several equidistantly spaced heat conducting fins of a certain height separated by gaps. Copper powder may cover the concave side of the top cover, and in the gaps between the fins on the top surface of the bottom, to form a heat conductor. The top cover and the bottom cover may be fit and brazed together to form a unit, where the gaps between the fins form a plurality of connected heat-circulating chambers. The heat-circulating chambers may be evacuated of air and completely filled with a working fluid.

Embodiments of the invention also relate to methods of making a heat sink module for light and thin electronic equipment. The methods may include the steps of providing a concave top cover and a bottom cover having on the top thereof several equidistantly spaced heat conducting fins of a certain height separated by gaps, and depositing copper powder on the concave side of the top cover and in the gaps between the fins to form a heat conductor. The methods may also include fitting and brazing the top cover and the bottom cover together to form a unit, where the gaps between the fins form a plurality of connected heat-circulating chambers. The methods may further include vacuuming the air out of the chambers and completely filling the chambers with working fluid using the hole in the side of the top cover.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

DETAILED DESCRIPTION OF THE INVENTION

Figure 1:
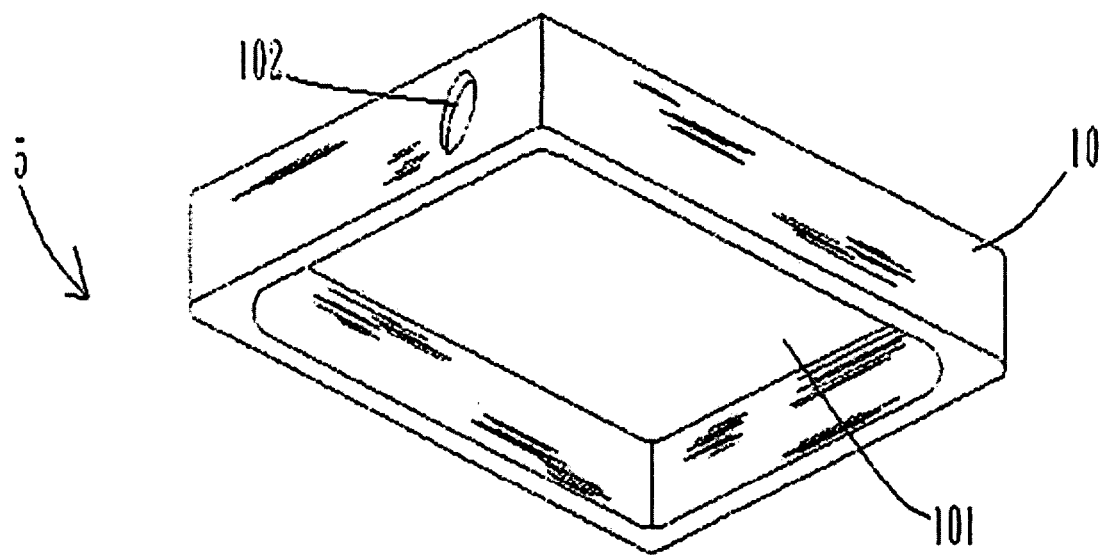
FIG. 1 is a perspective view of the components comprising the heat sink module of the invention.
Figure 1:
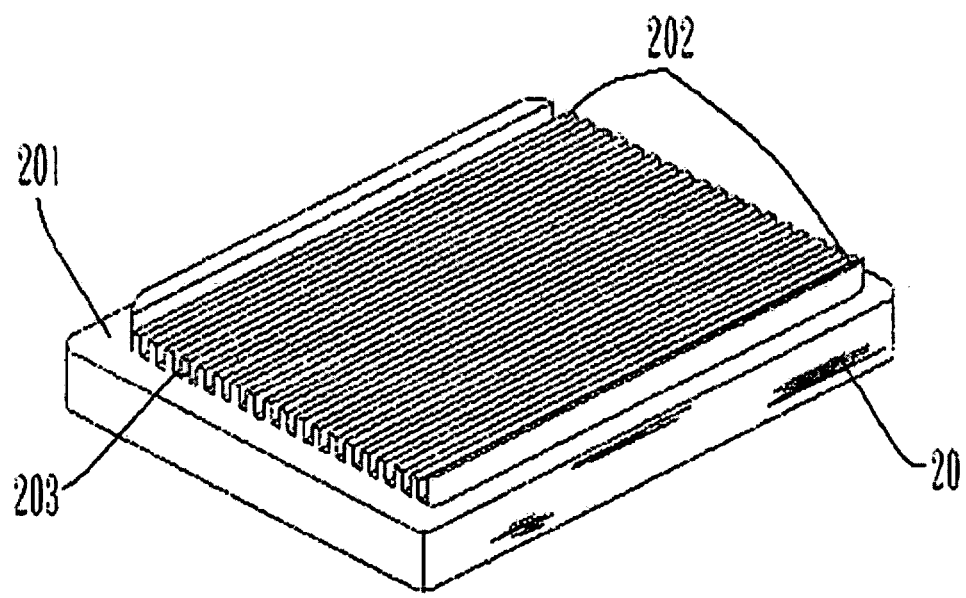

The present invention relates to a light and thin heat sink module especially made for light and thin electronic equipment, such as notebook computers ("notebooks"). This light and thin heat sink module comprises a concave top cover with a hole on the side for vacuuming air and a bottom cover. On the top of the bottom cover there is a plurality of equidistantly placed heat conducting fins that protrude to a certain height so as to naturally form a gap between each pair of fins. The concave top and protruding bottom are then fitted together to form a unit wherein the gaps provide many heat-circulating chambers. In accordance with the present invention, copper powder is deposited on the concave surface of the top cover and in the gaps formed by the fins. Air is then vacuumed out of the assembled unit by using the hole in the side of the top cover, and an appropriate amount of a functional fluid, e.g. water, is introduced into the hole to fill the heat-circulating chambers. The assembled unit is brazed to form a heat sink module suitable for light and thin electronic equipment. The top cover with the concave surface covered with copper powder is an good heat conductor. The present invention achieves a high heat transfer coefficient by using a functional fluid in the heat-circulating chambers. A functional fluid is one that undergoes a phase change from liquid to gas, allowing the gaseous molecules to transmit thermal energy away from the heat source. For example, the heat produced by a CPU (Central Processing Unit) may be rapidly taken away, lowering the CPU's working temperature and maintaining smooth operation of the electronic equipment.

The present invention is also directed to ameliorating the deficiencies of the current traditional method and technology in system heat dissipation in the thermal modules of notebook computers; i.e. the relatively high thermal resistance and cost associated with the use of many components, and the average heat conductivity resulting from the use of aluminum alloy heat sinks.

One purpose of the present invention is to provide a light and thin heat sink module especially made for light and thin electronic equipment such as notebooks. The heat sink module of the present invention comprises heat-circulating chambers containing a working fluid that undergoes a phase change from liquid to gas. The phase change absorbs the heat generated by the CPU and the resulting gaseous molecules transmit thermal energy so as to obtain a good heat transfer coefficient. The present invention rapidly dissipates the heat generated by the CPU, thereby greatly lowering the working temperature and maintaining the smooth operation of the light and thin electronic equipment. The working fluid can be any suitable fluid that will undergo the above-described phase changes and transmit heat energy in the gaseous phase in the manner described. One example of a working fluid is water.

The present invention uses the following technological method to achieve the aforementioned purpose. A light and thin heat sink module is made comprising a concave top cover with a hole on the side for vacuuming air and a bottom cover. Several heat conducting fins that protrude to a certain height are equidistantly located on the top side of the bottom cover. A gap is naturally formed between each pair of fins. The concave top and protruding bottom can be fitted together as a unit whereby the gaps form a plurality of heat-circulating chambers. Copper powder is deposited on the concave side of the top cover and between the gaps of the fins to provide an good heat conductor. When the top cover and bottom cover are fitted together, air is then vacuumed out of the assembled unit by using the hole on the side of the top cover, and an appropriate amount of working fluid is poured into the hole to fill up the heat-circulating chambers. The assembled unit is then brazed together to form a heat sink module suitable for light and thin electronic equipment.

Because the working fluid can fill the heat-circulating chambers of the heat sink module, when one end (the lower end) of the heat-circulating chambers of the heat sink module is heated, the working fluid vaporizes and the vapor rises to the other end (the upper end) of the heat-circulating chambers. The temperature is lower at the other end and the vapor condenses. The condensed liquid then returns to the original location it occupied before heating through the capillarity of the copper insulating wall or because of gravity. Using gaseous molecules as a method for transmitting thermal energy can obtain a heat transfer coefficient about ten times higher than that of aluminum or copper, to provide an improved heat conducting effect. With the good heat transfer coefficient, the heat circulating exchange can occur rapidly, and the heat generated by the CPU can be taken away quickly. The working temperature of the IC chip will be lowered and the smooth operation of the electronic equipment can be maintained.

The following description with reference to the drawings will help to explain the application and the principles of the invention for better understanding.

Referring to FIG. 1, a heat sink module 5 comprises a concave top cover 10 and a bottom cover 20. On the top side 201 of the bottom cover 20, there are several protruding heat conducting fins 202 of certain height located equidistantly apart. A gap 203 is naturally formed between two fins 202. The concave side 101 of top cover 10 can be fitted over the protruding bottom cover 20 to form a unit.

Figure 2:
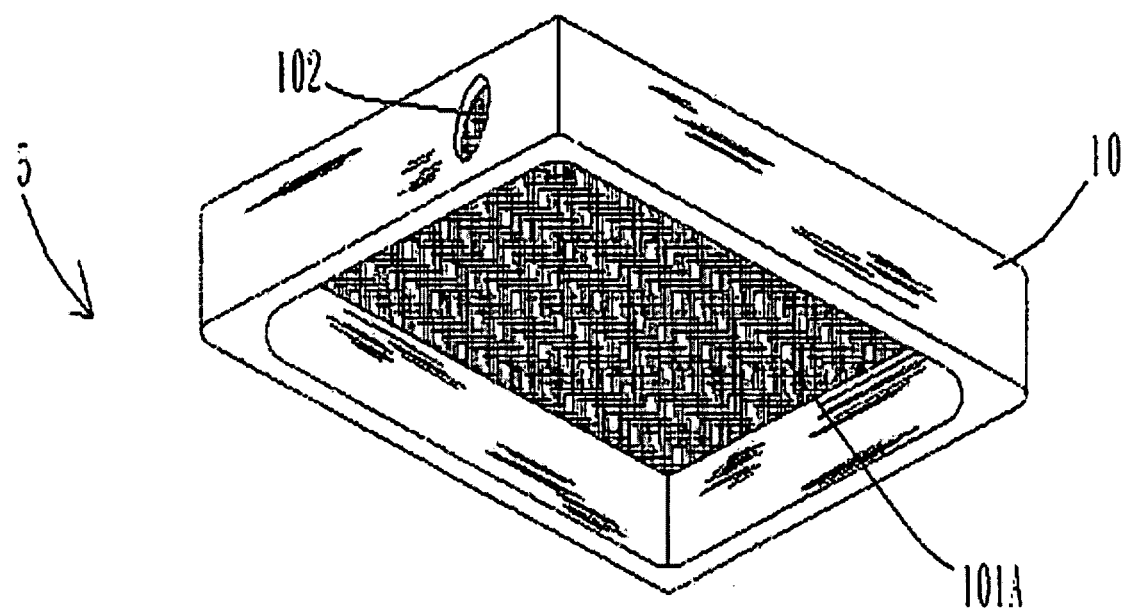
FIG. 2 is a perspective view of the concave top cover and the finned bottom cover showing the location of the copper powder.
Figure 2:
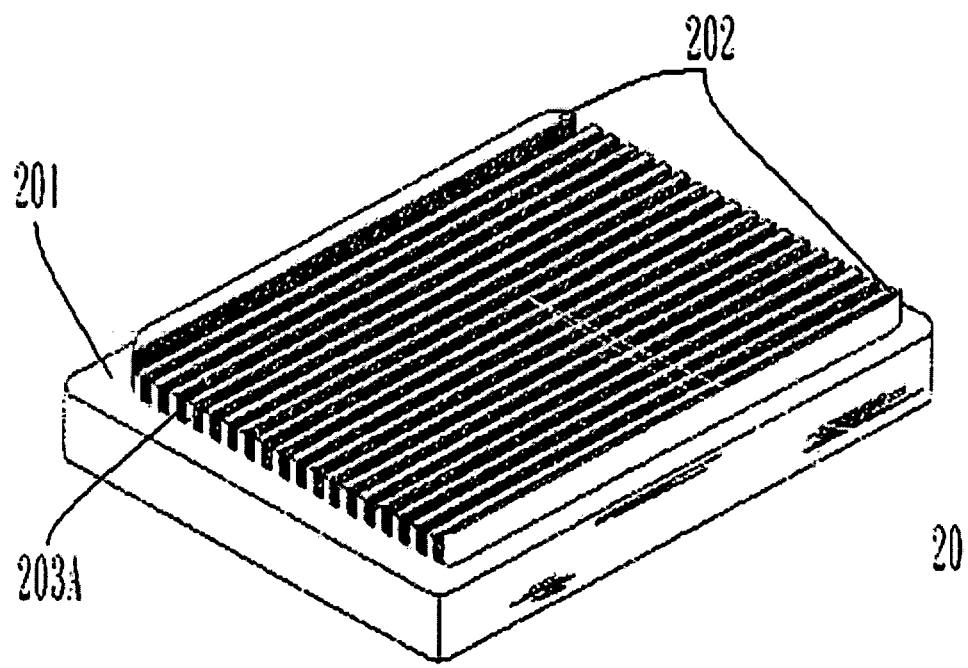
Figure 3:
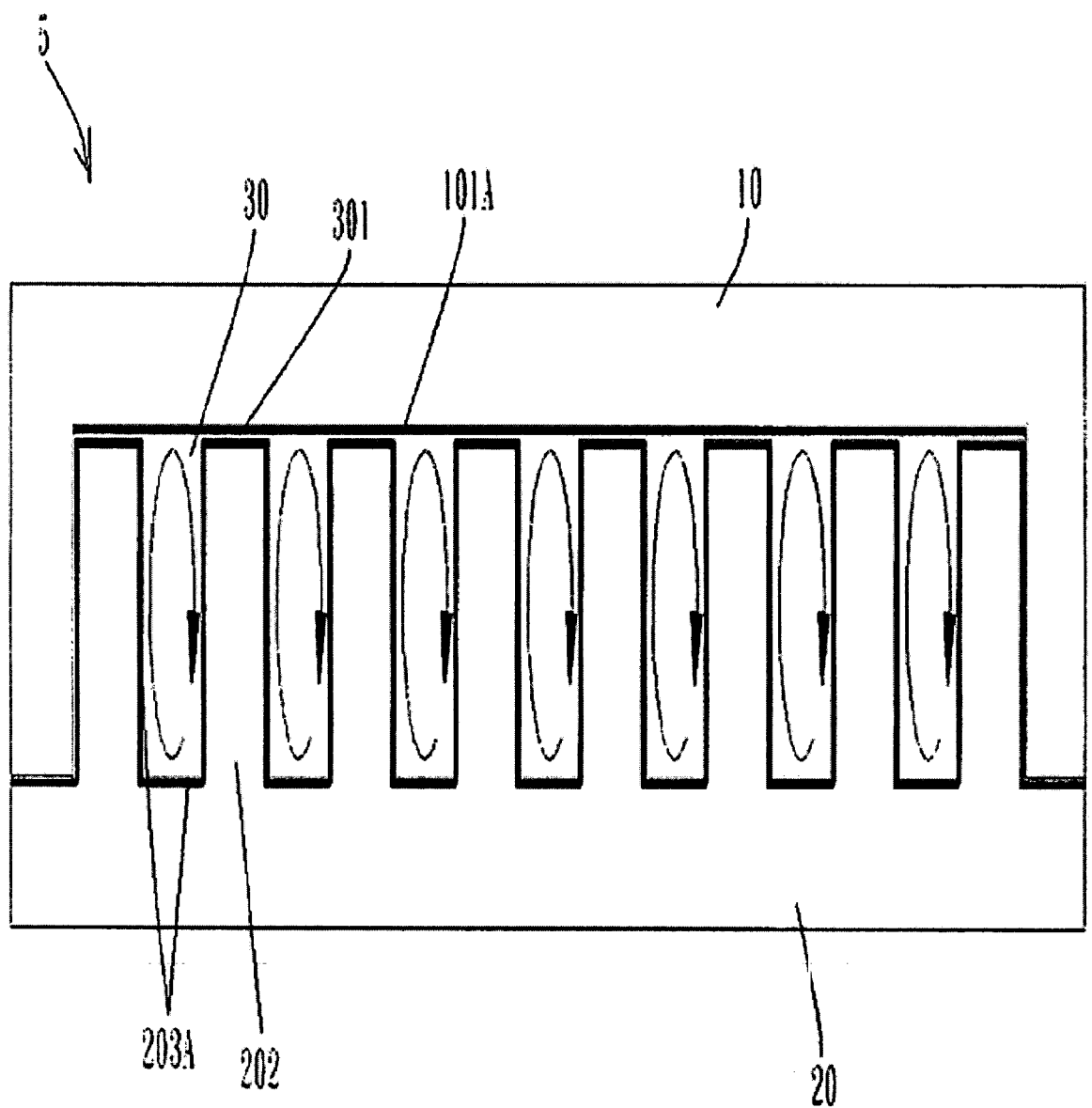
FIG. 3 is a cross-sectional view of the assembled heat sink module of the invention.

Referring to FIG. 2 and FIG. 3, copper powder (dark shaded area) is placed on the concave side 101A of the top cover 10 and in the gaps 203A of the fins 202 protruding from the top side 201 of the bottom cover 20. When the top cover 10 is fitted over the bottom cover 20, a plurality of internal heat-circulating chambers 30 (FIG. 3) are formed. The height of the protruding fins 202 on the top side 201 of the bottom cover 20 is calculated to be just high enough not to touch the concaved side 101A of the top cover 10. As a result, a gap 301 is formed between the concave side 101A and the fins 202 so that heat can flow between the chambers 30 to lower and equalize the temperature in the chambers 30 and hence accelerate the speed of heat dissipation. At this time air is vacuumed from the hole 102 located on the side of the top cover 10 of the heat sink module 5, and an appropriate amount of working fluid, e.g., water, is poured into the chambers. Since the concave side 101A and the gaps 203A between the fins are covered with copper powder, they are good heat conductors. The assembled unit is then brazed together to form heat sink module 5 suitable for light and thin electronic equipment.

When the heat sink module 5 is installed in the electronic equipment, the working fluid completely fills the heat-circulating chambers 30 of the heat sink module 5. When one end (the lower end) of the heat-circulating chambers 30 of the heat sink module 5 is heated, the working fluid vaporizes. The vapor then rises to the other end (the upper end) of the heat-circulating chambers 30 where the temperature is lower and condenses. At this time the condensed liquid then returns to the original location it occupied before heating through the capillarity of the concaved side 101A with copper powder or because of the effect of gravity. Using gaseous molecules as a method of transmitting thermal energy can obtain a heat transfer coefficient some ten-fold higher than that of aluminum or copper with very good heat conducting effect. With the good heat transfer coefficient, the heat-exchange cycle can immediately take away the heat generated by the CPU. Accordingly, the working temperature will greatly be lowered and the smooth operation of the electronic equipment can be maintained.

Figure 4:
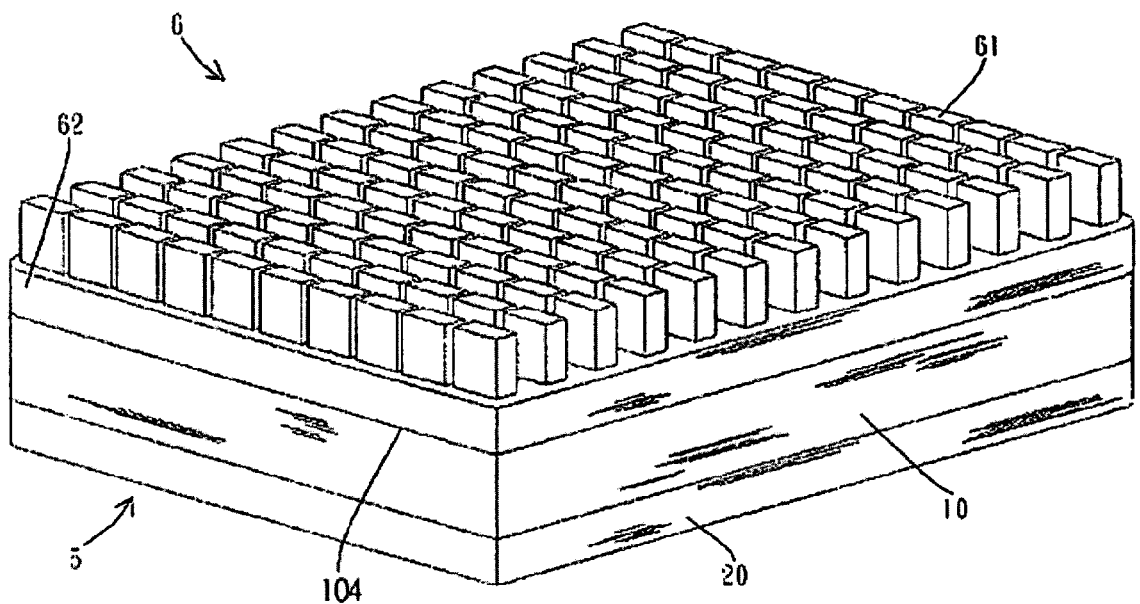
FIG. 4 is a perspective view of a first embodiment of the invention.

FIG. 4 illustrates one embodiment of the invention. After a heat sink module 5 has been assembled, an aluminum extruded heat sink module 6 of an appropriate height can be installed on the top 104 of the top cover 10. The extruded heat sink module 6 has a base 62 on which are located aluminum extruded heat sinks 61 of certain height to provide faster heat dissipating effect and speed.

Figure 5:
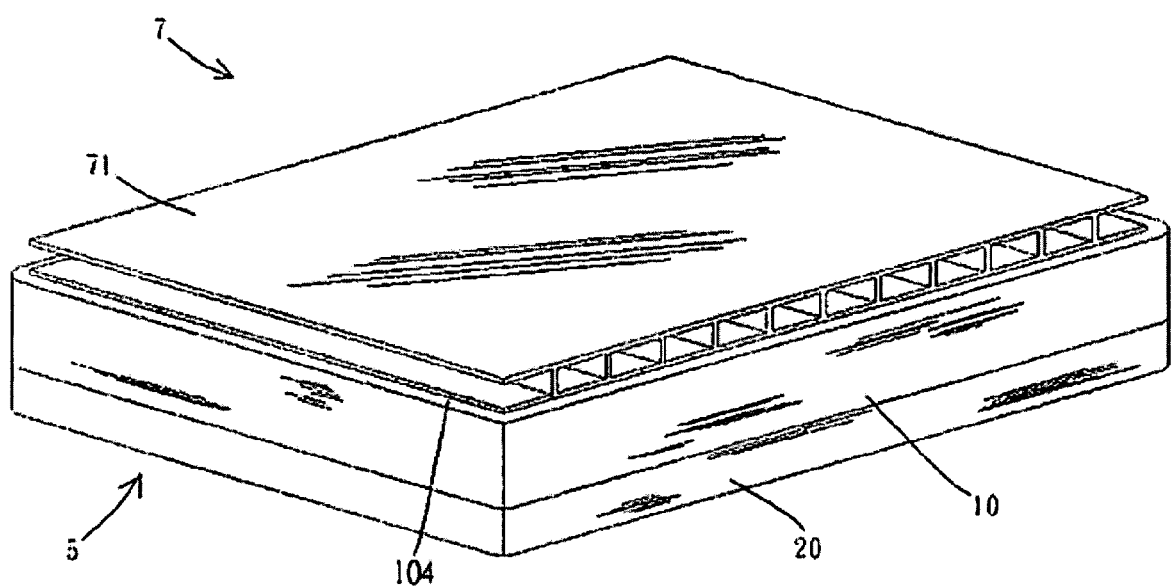
FIG. 5 is a perspective view of a second embodiment of the invention.

FIG. 5 illustrates a second embodiment of the invention. After a heat sink module 5 has been assembled, a flat heat sink module 71 can be installed on the top 104 of the top cover 10 to provide faster heat dissipating effect and speed.

Figure 6:
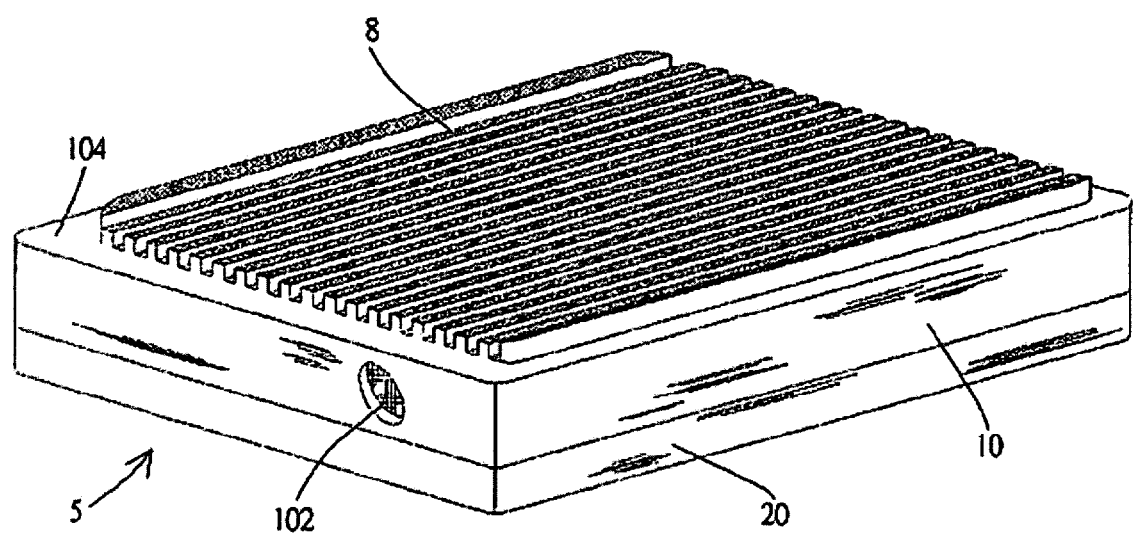
FIG. 6 is a perspective view of a third embodiment of the invention.

FIG. 6 illustrates a third embodiment of the invention. Many heat sinks 8 of an appropriate height can be installed on the top 104 of the top cover 10 to provide faster heat dissipating effect and speed.

Figure 7:
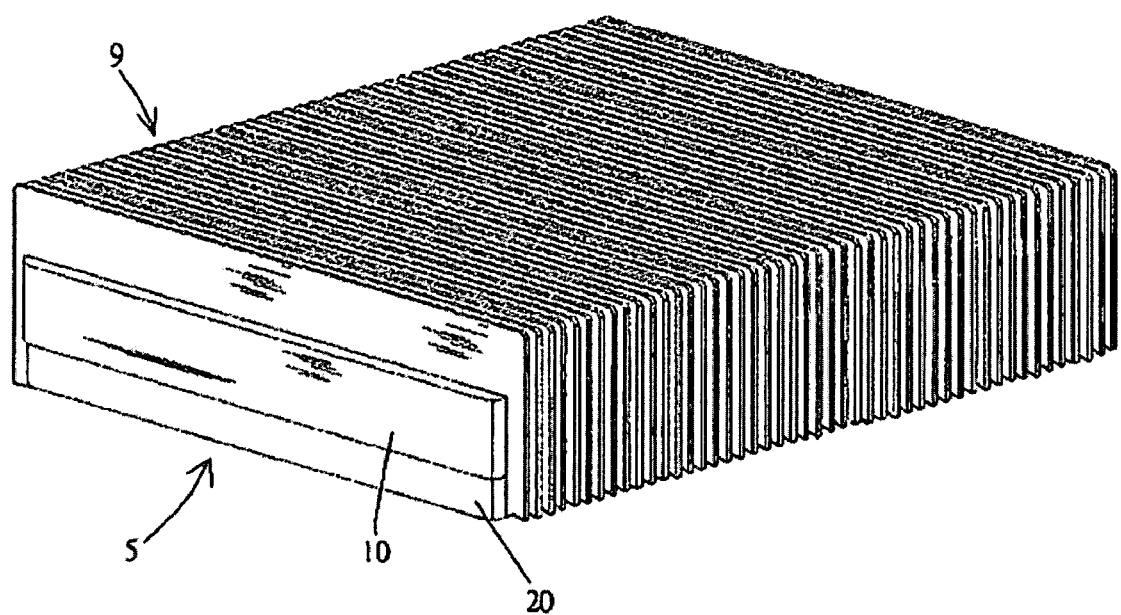
FIG. 7 is a perspective view of a fourth embodiment of the invention.

FIG. 7 illustrates a fourth embodiment of the invention. The heat sink module 5 can be inserted into a set of copper heat sinks 9. The combination of the heat sink module 5 with the set of copper heat sinks 9 provides faster heat convection and heat dissipation for electronic equipment by taking advantage of the heat sink module 5 characteristics of absorbing heat with the working fluid and phase change and transmitting thermal energy with gaseous molecules.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention. The aforementioned examples are used merely to explain various embodiments of the invention and are not intended to limit the scope of this invention. Any changes or modifications made within the scope of this invention are still intended to come within the scope of this patent application.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A heat sink module for light and thin electronic equipment comprising:
   a concave top cover;
   a bottom cover having on its top surface several equidistantly spaced heat conducting fins of a certain height separated by gaps; and
   copper powder covering the concave side of the top cover and in the gaps between the fins on the top surface of the bottom cover to form a heat conductor;
   the top cover and the bottom cover being fit and brazed together to form a unit wherein the gaps between the fins form a plurality of connected heat-circulating chambers;
   the heat-circulating chambers being evacuated of air and completely filled with a working fluid.

2. The heat sink module for light and thin electronic equipment as described in claim 1, wherein the working fluid is water.

3. The heat sink module for light and thin electronic equipment as described in claim 1, wherein the concave top cover has a hole in one side for vacuuming air out of the module and for introducing working fluid into the module.

4. The heat sink module for light and thin electronic equipment as described in claim 1, wherein several heat sinks of an appropriate height are installed on the top side of the top cover.

5. The heat sink module for light and thin electronic equipment as described in claim 1, wherein aluminum extruded heat sinks are installed on the top side of the top cover.

6. The heat sink module for light and thin electronic equipment as described in claim 1, wherein flat heat sinks are welded on the top side of the top cover.

7. The heat sink for light and thin electronic equipment as described in claim 1 that is suitable for a notebook computer.

8. The method of making a heat sink module for light and thin electronic equipment comprising the steps of:
   providing a concave top cover and a bottom cover having on the top thereof several equidistantly spaced heat conducting fins of a certain height separated by gaps;
   depositing copper powder on the concave side of the top cover and in the gaps between the fins to form a heat conductor;

fitting and brazing the top cover and the bottom cover together to form a unit wherein the gaps between the fins form a plurality of connected heat-circulating chambers; and vacuuming the air out of the chambers and completely filling the chambers with working fluid using a hole in the side of the top cover.

9. The method of making a heat sink module as described in claim 8, wherein the working fluid is water.

10. The method of making a heat sink module as described in claim 8, wherein the concave top cover has the hole in one side for vacuuming air out of the module and for introducing working fluid into the module.

11. The method of making a heat sink module as described in claim 8, wherein several heat sinks of an appropriate height are installed on the top side of the top cover.

12. The method of making a heat sink module as described in claim 8, wherein aluminum extruded heat sinks are installed on the top side of the top cover.

13. The method of making a heat sink module as described in claim 8, wherein flat heat sinks are welded on the top side of the top cover.

14. The method of making a heat sink module as described in claim 8 that is suitable for a notebook computer.

* * * * *